United States Patent
Zhuang et al.

(10) Patent No.: US 7,316,980 B2
(45) Date of Patent: Jan. 8, 2008

(54) METHOD FOR FORMING FERROCAPACITORS AND FERAM DEVICES

(75) Inventors: Haoren Zhuang, New York, NY (US); Ulrich Egger, Kanagawa-ken (JP); Rainer Bruchhaus, Munich (DE); Karl Hornik, Kanagawa-ken (JP); Jenny Lian, New York, NY (US); Stefan Gernhardt, Kanagawa-ken (JP)

(73) Assignee: Infineon Technologies AG, Munich (DE)

(*) Notice: Subject to any disclaimer, the term of this patent is extended or adjusted under 35 U.S.C. 154(b) by 261 days.

(21) Appl. No.: 10/678,758

(22) Filed: Oct. 2, 2003

(65) Prior Publication Data

US 2005/0074979 A1 Apr. 7, 2005

(51) Int. Cl.
*H01L 21/302* (2006.01)
(52) U.S. Cl. ............... 438/720; 438/629; 438/633; 438/710
(58) Field of Classification Search ............... 438/691, 438/692, 706, 710, 720, 629, 633
See application file for complete search history.

(56) References Cited

U.S. PATENT DOCUMENTS

| | | | |
|---|---|---|---|
| 6,033,919 A | 3/2000 | Gnade et al. | |
| 6,259,125 B1* | 7/2001 | Fazan et al. | 257/298 |
| 6,300,652 B1 | 10/2001 | Risch et al. | |
| 6,351,005 B1 | 2/2002 | Al-Shareef et al. | |
| 6,642,564 B2* | 11/2003 | Ogawa et al. | 257/296 |
| 6,753,437 B1* | 6/2004 | Sagae et al. | 556/40 |
| 2001/0031529 A1 | 10/2001 | Hofmann et al. | |
| 2001/0055869 A1* | 12/2001 | Marsh | 438/597 |
| 2002/0154265 A1* | 10/2002 | Hubby, Jr. | 349/159 |
| 2003/0155595 A1* | 8/2003 | Okita | 257/295 |
| 2003/0227799 A1* | 12/2003 | Higo et al. | 365/200 |

FOREIGN PATENT DOCUMENTS

DE 43 36 001 4/1995

\* cited by examiner

*Primary Examiner*—Lan Vinh
(74) *Attorney, Agent, or Firm*—Fish & Richardson P.C.

(57) ABSTRACT

Ferrocapacitors having a vertical structure are formed by a process in which a ferroelectric layer is deposited over an insulator. In a first etching stage, the ferroelectric material is etched to form openings in it, leaving the insulating layer substantially intact. Then a conductive layer is deposited into the openings formed in the ferroelectric layer, forming electrodes on the sides of the openings. Further etching is performed to form gaps in the $Al_2O_3$ layer, for making connections to conductive elements beneath it. Thus, by the time the second etching step is performed; there are already electrodes overlying the sides of the ferroelectric material, without insulating fences in between.

16 Claims, 5 Drawing Sheets

METHOD FOR FORMING FERROCAPACITORS AND FERAM DEVICES

FIELD OF THE INVENTION

The present invention relates to methods for forming ferrocapacitors of the kind used in FeRAM devices, and to methods for forming FeRAM devices themselves. The invention further relates to FeRAM devices including ferrocapacitors formed by the method.

BACKGROUND OF INVENTION

Many conventional FeRAM devices include a horizontal ferrocapacitor structure, in which a stack of layers is formed including top and bottom electrodes sandwiching a ferroelectric layer. An alternative "vertical capacitor" structure was suggested in U.S. Pat. No. 6,300,652, the disclosure of which is incorporated herein by reference. A vertical capacitor includes a ferroelectric element sandwiched between electrodes to either side, all at substantially the same level in the FeRAM device.

The process steps of a conventional technique for forming a vertical capacitor structure are illustrated in FIGS. 1 to 5. The vertical capacitors are typically formed over a substructure, which may for example be of the form shown in FIG. 1 in which various electronic components 1 are connected to conductive plugs 3 which extend upwards through a matrix 5 (e.g. of TEOS (tetraethylorthosilicate)). The upper ends of the plugs 3 terminate in TiN/Ir barrier elements 7, having a top surface flush with the surface of the matrix 5.

As shown in FIG. 2, an insulating layer 9 of $Al_2O_3$ is formed over the surface of the matrix 5, and a layer of ferroelectric material 11 such as PZT ($PbZrTiO_3$) is formed over that.

As shown in FIG. 3, hardmask elements 13 are deposited in selected areas of the PZT layer 11, and the portions of the PZT and $Al_2O_3$ which are not protected by the hardmask elements 13 are etched all the way through, forming openings 17. During this process $Al_2O_3$ fences 15 are often formed on the sides of the remaining PZT.

The openings 17 are then filled with conductive material 19 such as $IrO_2$, by depositing $IrO_2$ over the entire structure, as shown in FIG. 4, and chemical-mechanical planarization (CMP) polishing is performed to form a flat upper surface 21 which is partly the PZT 11 and partly the conductive material 19. Then, as shown in FIG. 5, an $Al_2O_3$ layer 23 is formed over the surface 21. The elements 19 of $IrO_2$ constitute electrodes, while the remaining PZT 11 forms the dielectric.

The vertical capacitor structure has great potential for reducing the cell size, especially if the etching taper angle of the remaining PZT 11 (i.e. the angle between the horizontal direction and the sides of the remaining PZT) is high. However, if the taper angle becomes close to 90°, the $Al_2O_3$ fences 15 are more likely to be formed. These fences 15 are difficult to remove (e.g. by a wet cleaning process), and dramatically reduce the $Q_{SW}$ (i.e. the maximum charge which can be stored in the ferrocapacitor) because the insulating fences 15 reduce the effective area of the capacitor.

SUMMARY OF THE INVENTION

The present invention aims to alleviate the above problem, at least partially, and in particular to provide a new and useful method for forming ferrocapacitors and FeRAM devices with improved properties.

In general terms, the present invention proposes that the etching of the ferroelectric material and $Al_2O_3$ layer is performed in a two stage process: in a first stage only the ferroelectric material is etched to form openings in it, leaving the $Al_2O_3$ layer substantially Intact (so that fences are not produced); then an electrode layer is deposited into the openings formed in the ferroelectric layer, then further etching is performed to form openings in the $Al_2O_3$ layer. Thus, by the time the second etching step is performed, there are already electrodes overlying the sides of the ferroelectric material, without insulating fences in between.

Specifically, in a first aspect the invention proposes a method for forming a ferrocapacitor which include the steps of:

depositing a ferroelectric material over an Insulating layer;

a first etching step of etching of the ferroelectric material to form openings in it, depositing an electrode layer into the openings formed in the ferroelectric layer;

is a second etching step, after depositing the electrode layer, of etching the insulating layer at the bottom of the openings to form gaps in it; and inserting conductive material into the gaps.

The invention further provides the ferrocapacitor devices produced by the method, and FeRAM devices including such ferrocapacitors.

BRIEF DESCRIPTION OF THE FIGURES

Preferred features of the Invention will now be described, for the sake of illustration only, with reference to the following figures in which.

DETAILED DESCRIPTION OF THE EMBODIMENTS

Figure 1:
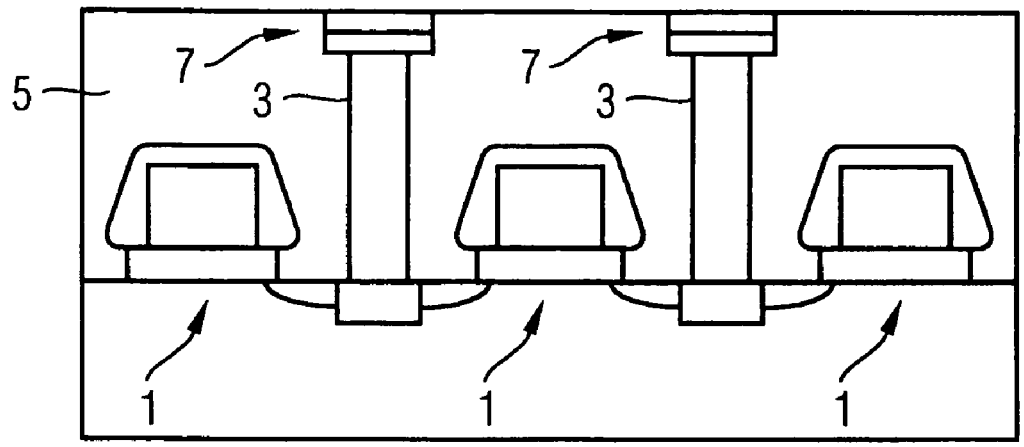
FIGS. 1 to 5 show the steps of a convention method of forming vertical capacitors.
Figure 2:
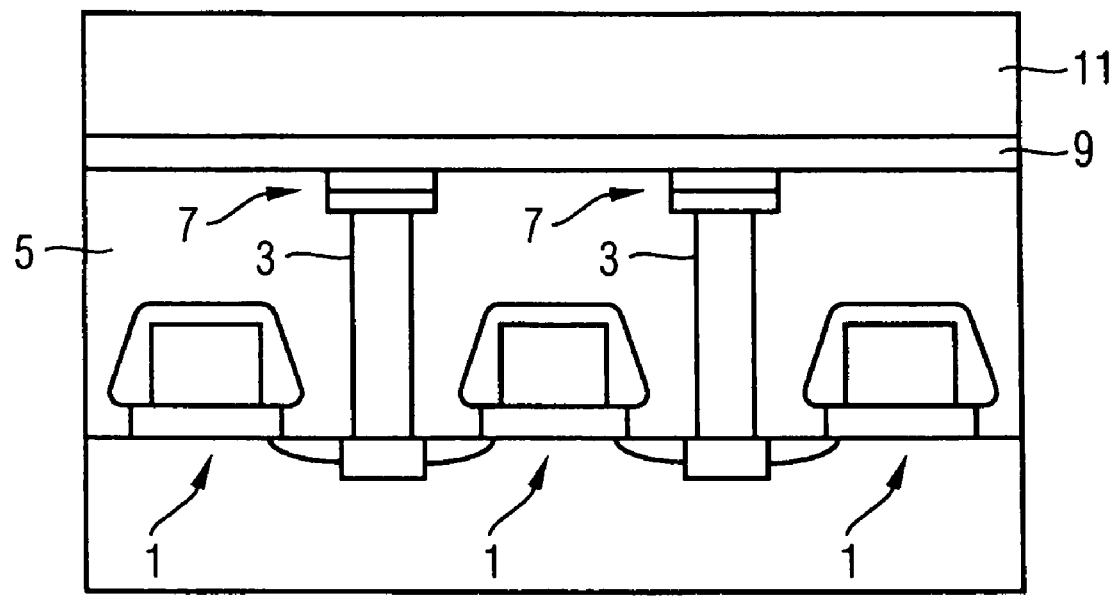
Figure 3:
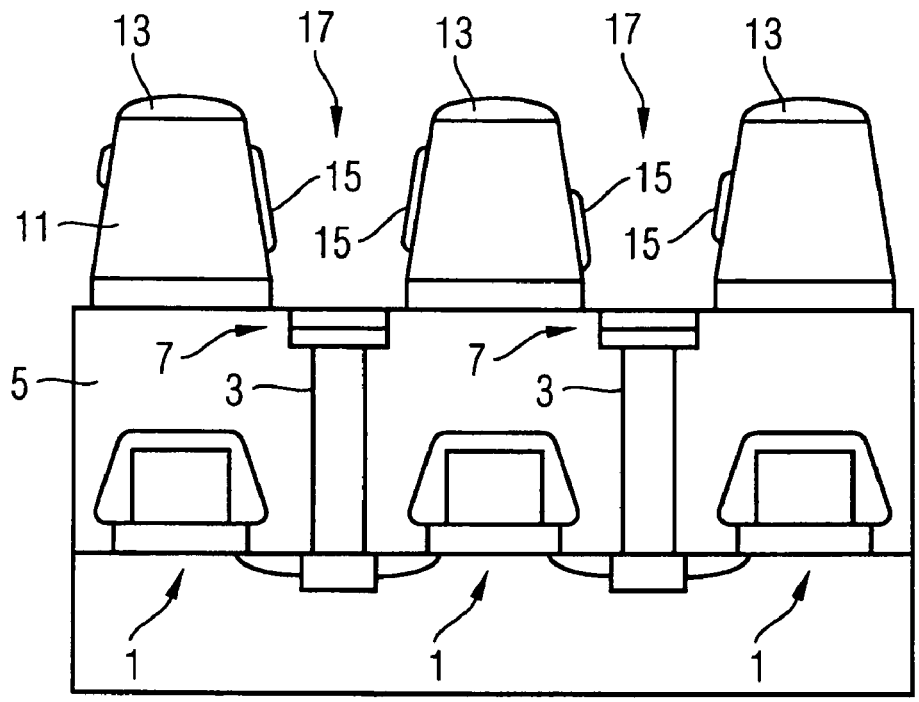
Figure 4:
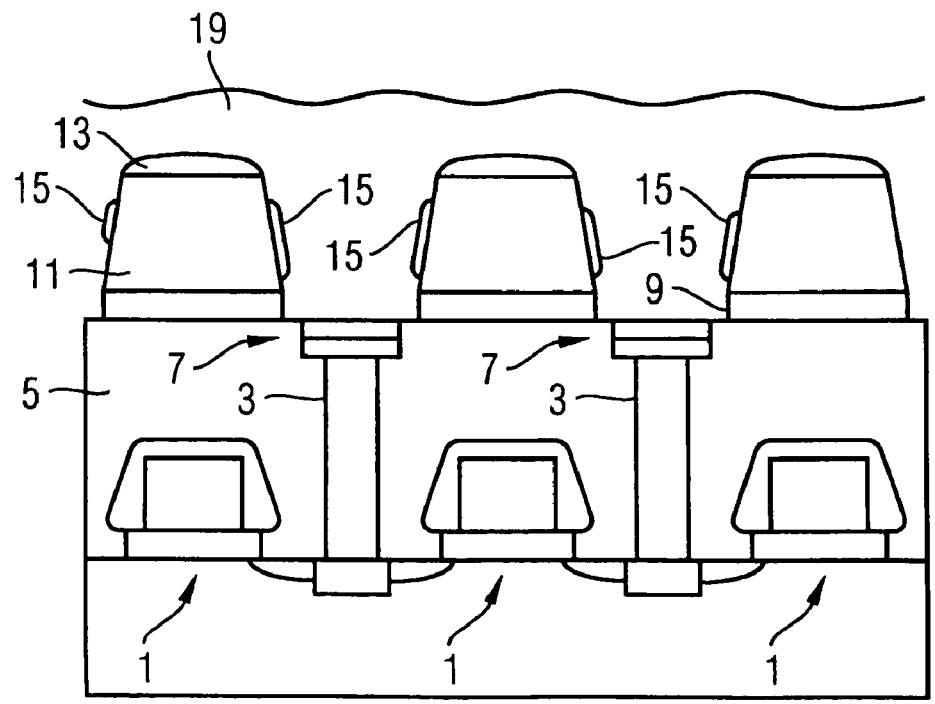
Figure 5:
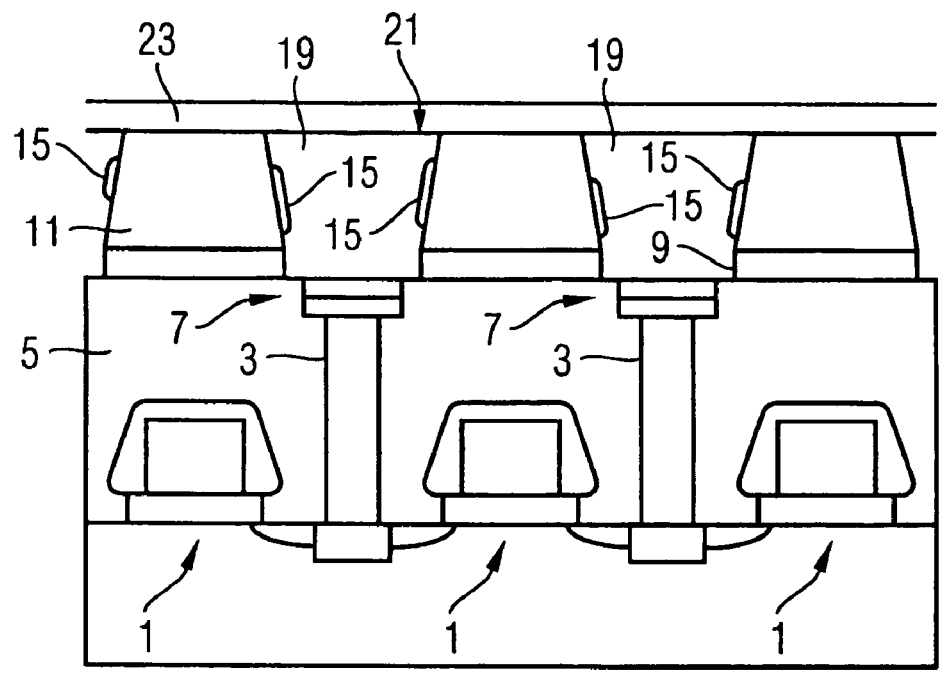

The method which is an embodiment of the invention will be explained with reference to FIGS. 6 to 9. The vertical capacitor structure is formed in these figures over a substructure as shown in FIG. 1. Elements shown in FIGS. 1 to 5 which exactly correspond to elements in FIGS. 6 to 9 are illustrated by the same reference numerals.

Figure 6:
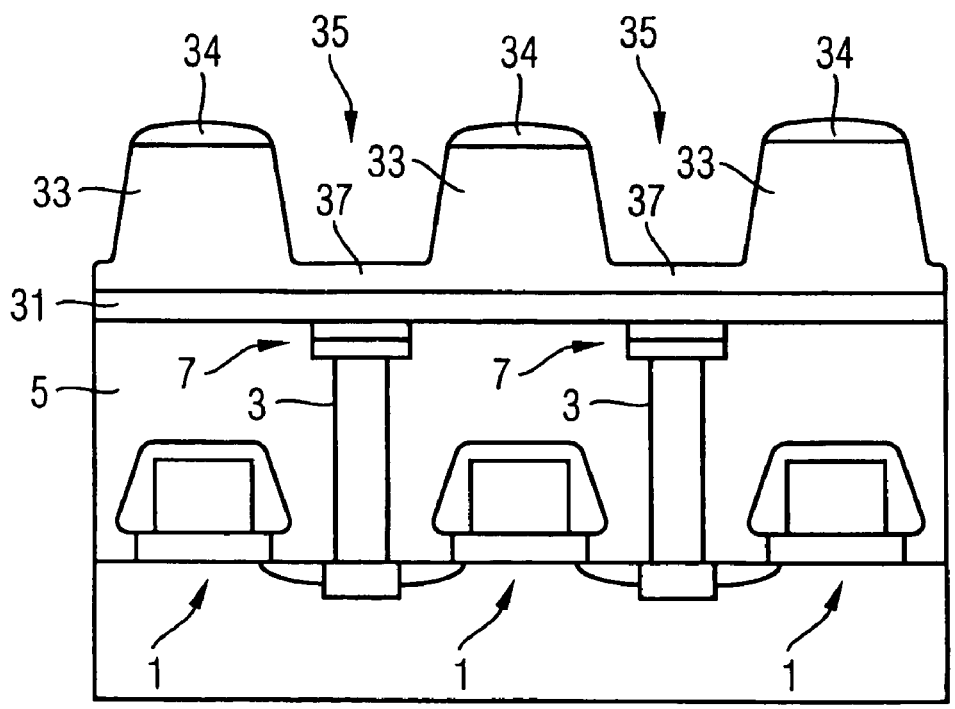
FIGS. 6 to 9 show the steps of a method which is an embodiment of the invention.

The first step of the method, as in the conventional method is for a layer 31 of an Insulating material such as $Al_2O_3$ to be formed over the substructure, and for a thicker layer 33 of ferroelectric material (typically PZT) to be formed over the $Al_2O_3$ layer 31. Hardmask elements 34 are formed over the PZT layer 33 in a formation which exposes areas of the PZT (e.g. circular, square or rectangular areas) which overlie the barrier elements 7. Then, etching is carried out, using the hardmask elements 34 to form a plurality of openings 35 in the PZT, as shown in FIG. 6. However, in contrast to FIG. 3, the openings 35 do not extend through the whole of the PZT layer 33. Typically, a thin layer 37 of PZT remains at the bottom of the openings 35, and in particular the $Al_2O_3$ layer 31 is not disturbed.

Figure 7:
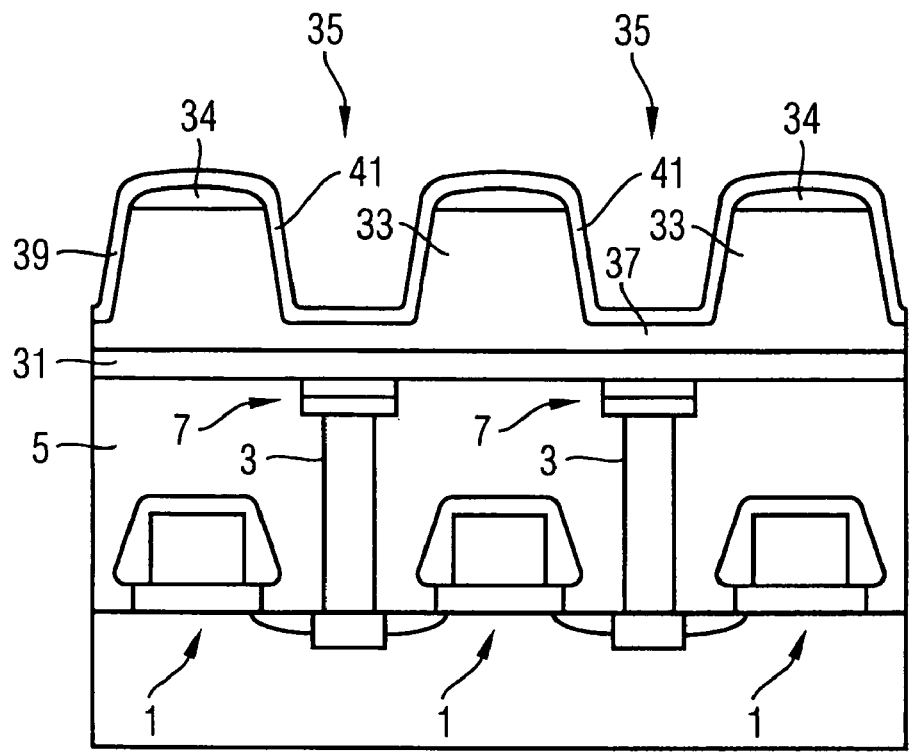

As shown in FIG. 7, a layer 39 of a conductive material, e.g. $IrO_2$ is then formed over the structure of FIG. 6, including in particular portions 41 on the sides of the openings. The portions 41 will constitute electrode elements in the completed ferrocapacitor device, as explained below. A possible thickness range for the layer 39 would be 15 nm to 20 nm.

Figure 8:
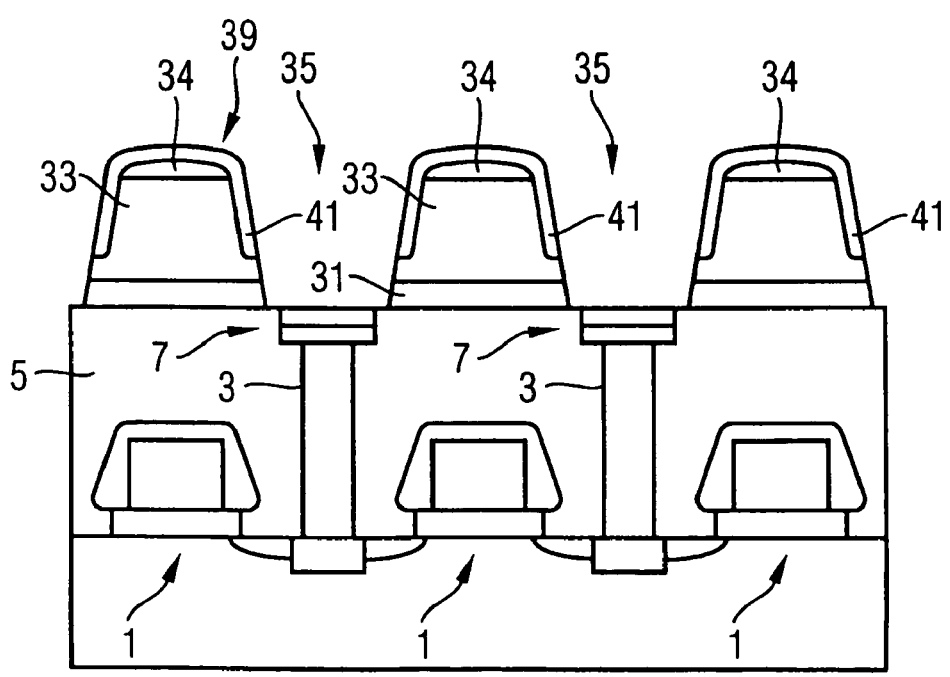
Figure 9:
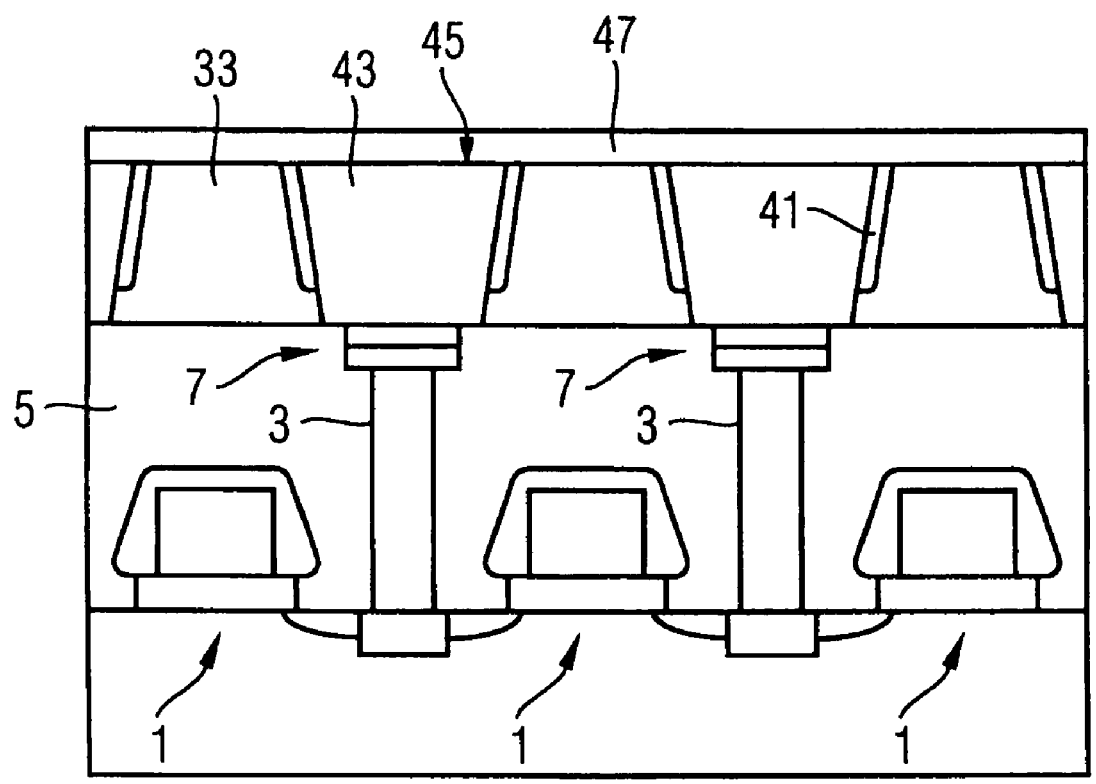

As shown in FIG. 8, further etching is performed. This further etching thins the layer 39 of conductive material in all places, and in particular removes completely the portions of the layer 39 at the bottom of the openings 35. Furthermore, the thin layer 37 of PZT at the bottom of the openings 35 is removed, and the openings 35 are extended through the $Al_2O_3$ layer 31, to form gaps in it at which the tops of the barrier elements 7 are exposed. During this process, it is possible that fences of $Al_2O_3$ will be formed on the portions 41 of the layer 39 on the sides of the openings, but nevertheless the entire sides of the remaining parts of the PZT layer 33 are in contact with the electrode elements 41, and therefore have no influence on the $Q_{SW}$.

Subsequently, the openings 35 are filled with further conductive material 43, such as more $IrO_2$. Then, as in the conventional method, CMP polishing is performed to form a flat upper surface 45 which is partly the PZT 33 and partly the conductive material 43. Then, an $Al_2O_3$ layer 47 is formed over the surface 45, to form the completed structure shown in FIG. 9, The conductive material 43 makes electrical contact with the barrier elements 7 and the electrode elements 41 remaining from the layer 39, thereby electrically connecting the electrode elements 41 with desired electrical components of the substructure.

Although only a single embodiment of the invention has been described in detail, many variations of the method are possible within the scope of the invention as will be clear to a skilled reader.

The invention claimed is:

1. A method for forming a vertical ferrocapacitor comprising:
   depositing a ferroelectric material on an insulating layer;
   a first etching step of etching of the ferroelectric material to form openings in the ferroelectric material;
   depositing an electrode layer on the openings in the ferroelectric material;
   a second etching step, after depositing the electrode layer, of etching to form gaps in the electrode layer and the insulating layer at the bottom of the openings; and
   inserting conductive material into the gaps at least on a portion of the electrode layer.

2. A method according to claim 1 in which the first etching step leaves a film of ferroelectric material remaining at the bottom of the openings, and the film of ferroelectric material is removed during the second etching step.

3. A method according to claim 1 further comprising planarizing to form a flat upper surface on the ferroelectric material and depositing an insulating layer over it, after inserting the conductive material.

4. A method according to claim 3 in which the conductive material substantially fills the openings at least up to the planarization level.

5. A method according to claim 1 wherein the electrode layer has a thickness in the range of 15 nm to 20 nm.

6. A method according to claim 1 wherein the insulating layer is $Al_2O_3$.

7. A method according to claim 1 wherein the ferroelectric material is PZT.

8. A method according to claim 1 wherein the electrode layer contains iridium.

9. A method according to claim 1 wherein the conductive material contains iridium.

10. A method for forming a ferrocapacitor includes the steps of:
    depositing a ferroelectric material over an insulating layer;
    a first etching step of etching of the ferroelectric material to form openings in the ferroelectric material, but leaving a film of ferroelectric material remaining at the bottom of the openings;
    depositing an electrode layer into the openings formed in the ferroelectric material;
    a second etching step, after depositing the electrode layer, of etching the film of the ferroelectric material and the insulating layer at the bottom of the openings to form gaps; and
    inserting conductive material into the gaps.

11. A method for forming a vertical ferrocapacitor comprising:
    depositing a ferroelectric material over an insulating layer;
    a first etching step of etching of the ferroelectric material to form openings in the ferroelectric material;
    depositing an electrode layer into the openings formed in the ferroelectric material;
    a second etching step, after depositing the electrode layer, of etching to form gaps in the electrode layer and the insulating layer at the bottom of the openings;
    inserting conductive material into the gaps; and
    planarizing to form a flat upper surface on the ferroelectric material and depositing an insulating layer over the upper surface, after inserting the conductive material.

12. A method according to claim 11 in which the conductive material substantially fills the openings at least up to the planarization level.

13. A method for forming a vertical ferrocapacitor comprising:
    depositing a ferroelectric material over an insulating layer;
    a first etching step of etching of the ferroelectric material to form openings in the ferroelectric material;
    depositing an electrode layer into the openings formed in the ferroelectric material, the electrode layer has a thickness in the range of 15 nm to 20 nm;
    a second etching step, after depositing the electrode layer, of etching to remove the electrode layer and the insulating layer at the bottom of the openings; and
    inserting conductive material into the gaps.

14. A method for forming a vertical ferrocapacitor comprising:
    depositing a ferroelectric material over an insulating layer, the insulating layer is $Al_2O_3$;
    a first etching step of etching of the ferroelectric material to form openings in the ferroelectric material;
    depositing an electrode layer into the openings formed in the ferroelectric material;
    a second etching step, after depositing the electrode layer, of etching to create gaps in the electrode layer and the insulating layer at the bottom of the openings; and
    inserting conductive material into the gaps.

15. A method for forming a vertical ferrocapacitor comprising:
    depositing a ferroelectric material over an insulating layer;
    a first etching step of etching of the ferroelectric material to form openings in the ferroelectric material;
    depositing an electrode layer into the openings formed in the ferroelectric material, wherein the electrode layer contains iridium;

a second etching step, after depositing the electrode layer, of etching to create gaps in the electrode layer and the insulating layer at the bottom of the openings; and inserting conductive material into the gaps.

16. A method for forming a vertical ferrocapacitor comprising:

depositing a ferroelectric material over an insulating layer;

a first etching step of etching of the ferroelectric material to form openings in the ferroelectric material;

depositing an electrode layer into the openings formed in the ferroelectric material;

a second etching step, after depositing the electrode layer, of etching to create gaps in the electrode layer and the insulating layer at the bottom of the openings; and inserting conductive material into the gaps, wherein the conductive material contains iridium.

* * * * *